United States Patent [19]
Bradley

[11] Patent Number: 5,345,193
[45] Date of Patent: Sep. 6, 1994

[54] PHASE LOCKED LOOP WITH LOOP GAIN STABILIZATION CIRCUIT

[75] Inventor: Donald A. Bradley, Morgan Hill, Calif.

[73] Assignee: Wiltron Company, Morgan Hill, Calif.

[21] Appl. No.: 98,519

[22] Filed: Jul. 28, 1993

[51] Int. Cl.⁵ .................... H03L 7/08; H03L 7/093
[52] U.S. Cl. ........................ 331/16; 331/17; 331/18; 331/25
[58] Field of Search ................ 331/15, 16, 17, 18, 331/25

[56] References Cited

U.S. PATENT DOCUMENTS 4,864,257  9/1989  Vandegraaf ............... 332/127 X
4,965,533 10/1990  Gilmore .................... 331/18

Primary Examiner—Siegfried H. Grimm
Attorney, Agent, or Firm—Fliesler, Dubb, Meyer & Lovejoy

[57] ABSTRACT

A phase locked loop includes a linear phase detector responsive to a first signal having a predetermined range of frequencies and a second signal for comparing the relative phase of the first signal and the second signal, and a loop gain stabilization circuit coupled between the source of the first signal and the linear phase detector for reducing the magnitude of variations in the loop gain of the phase locked loop over the predetermined range of frequencies of the first signal source. An embodiment of the linear phase detector comprises a harmonic sampler/presteer circuit. The construction and operation of the loop gain stabilization circuit depends on whether the phase locked loop is being used in a frequency multiplying or dividing circuit.

42 Claims, 5 Drawing Sheets

PHASE LOCKED LOOP WITH LOOP GAIN STABILIZATION CIRCUIT

BACKGROUND OF THE INVENTION

1. Field Of the Invention

The present invention relates to phase locked loops comprising linear phase detectors/comparators in general and in particular to a phase locked loop comprising a linear phase comparator with a loop gain stabilization circuit for providing a relatively constant loop gain in such circuits over a wide range of frequencies.

2. Description of the Related Art

A linear phase comparator in the form of a harmonic sampler can be used advantageously in place of a conventional digital detector in a phase locked loop for dividing and multiplying microwave frequencies in ultra low phase noise microwave frequency synthesizers and other microwave circuits so long as a means, i.e. a frequency presteer circuit, is provided for setting the initial nominal frequency of the voltage controlled oscillator (VCO) in the loop. For example, in applicant's U.S. patent application, Ser. No. 08/060,755, filed May 12, 1993, entitled ULTRA LOW PHASE NOISE MICROWAVE SYNTHESIZER, and in applicant's U.S. patent application, Ser. No. 08/051,624, filed Apr. 22, 1993, entitled ULTRA LOW NOISE FREQUENCY DIVIDER/MULTIPLIER there are disclosed frequency multiplier and divider circuits comprising harmonic samplers/presteer circuits in otherwise conventional phase locked loops.

As discussed in applicant's above-identified patent applications, the contents of which are included herein by reference, the intermediate frequency ($F_{if}$) output of a harmonic sampler becomes a direct current (dc) level, i.e. null, whenever the frequency $F_{rf}$ of the high frequency input signal of the sampler is a harmonic of the sampling frequency $F_s$. For this reason a presteer circuit is employed to drive the VCO to a selected initial nominal frequency. Once the presteer circuit has driven the VCO to the selected nominal frequency, i.e. selected harmonic of the sampler, the output of the presteer circuit is disabled and the normal output of the sampler takes over and controls the frequency of the VCO.

In most, if not all, phase locked loops it is important that the loop gain of the phase locked loop remain relatively stable. As will be appreciated, whenever the loop gain is not constant over a broad operating frequency range of a VCO, the frequency of the VCO becomes an unpredictable function of the phase difference between the frequency of the VCO and a reference frequency, e.g. the sampling frequency, of a harmonic sampler.

SUMMARY OF THE INVENTION

In view of the foregoing, principle objects of the present invention are a method and apparatus comprising a phase locked loop having a linear phase comparator and a loop gain stabilization circuit for stabilizing the loop gain in the phase locked loop over a predetermined range of frequencies, e.g. 600 MHz to 1200 MHz.

Other objects of the present invention are a method and apparatus comprising a phase locked loop having a linear phase comparator and a loop gain stabilization circuit for stabilizing the loop gain in the phase locked loop in a frequency multiplier circuit.

Other objects of the present invention are a method and apparatus comprising a phase locked loop having a linear phase comparator and a loop gain stabilization circuit for stabilizing the loop gain in the phase locked loop in a frequency divider circuit.

In accordance with the above objects there is provided in an embodiment of the present invention a phase locked loop for use in a frequency multiplier circuit comprising a linear phase detector and loop gain stabilization circuit for restricting variations in the loop gain of the phase locked loop to a predetermined maximum positive and negative variation, e.g. approximately ±1 dB, over a predetermined VCO operating frequency range, e.g., 600 MHz to 1200 MHz.

In accordance with the above objects there is provided in another embodiment of the present invention a phase locked loop for use in a frequency divider circuit comprising a linear phase detector and a loop gain stabilization circuit for stabilizing the loop gain by attenuating the high frequency input to the linear phase comparator in the phase locked loop at a rate of approximately 6 dB/octave over a predetermined operating frequency range, e.g., 600 MHz to 1200 MHz.

In each of the above-described embodiments the linear phase comparator comprises a harmonic sampler/presteer circuit, a linear multiplier, or the like, and the loop gain stabilization circuit comprises a passive network comprising an inductor, a plurality of resistors and a plurality of capacitors.

BRIEF DESCRIPTION OF THE DRAWINGS

The above and other objects, features and advantages of the present invention will become apparent from the following detailed description of the accompanying drawings, in which.

DESCRIPTION OF THE PREFERRED EMBODIMENTS

Figure 1:
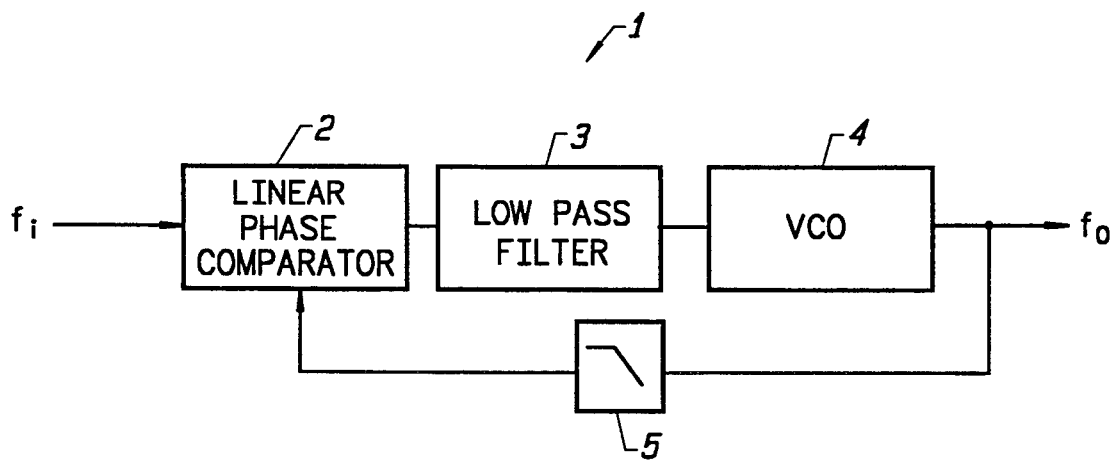
FIG. 1 is a generalized block diagram of a phase locked loop for use in a multiplier circuit according to the present invention.

Referring to FIG. 1, there is provided a phase locked loop designated generally as 1 for use in a multiplier circuit in accordance with the present invention. In the phase locked loop 1 there is provided a linear phase comparator 2, a low pass filter 3, a voltage controlled oscillator (VCO) 4 and a loop gain stabilization filter 5.

In operation, the phase of an input signal having a frequency $F_i$ is compared with the phase of the output of the VCO 4 having a frequency $F_o$ in the linear phase comparator 2. The low pass filter 3 filters out the high frequency components from the output of the linear phase comparator 2 for controlling the frequency of the VCO 4. As will be further described below in connection with a description of the present invention relating to its embodiment in multiplying circuits, the filter 5 compensates for variations in the loop gain as a function of frequency which result from the linear phase comparator 2 and the VCO 4.

Figure 2:
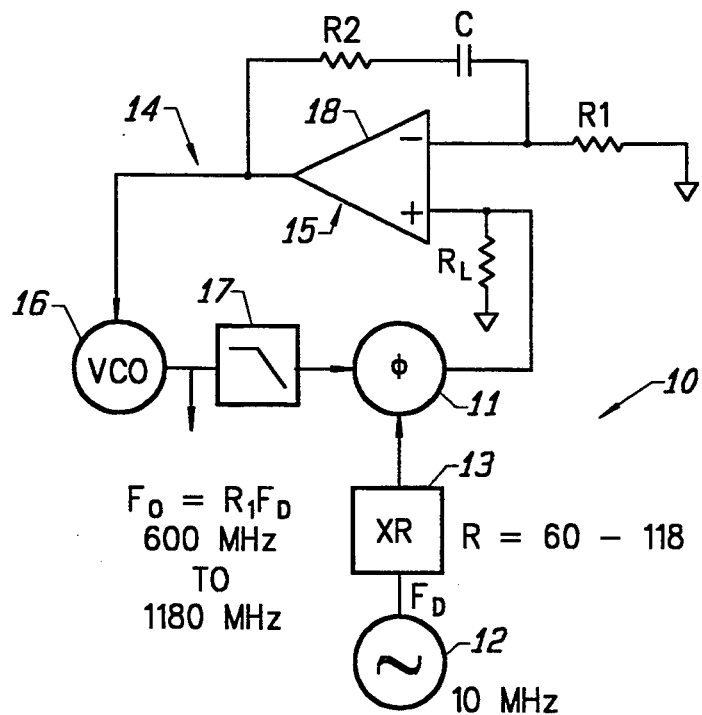
FIG. 2 is a block diagram of a multiplier circuit comprising a linear phase detector and loop gain stabilization circuit according to the present invention.

Referring to FIG. 2, there is provided in accordance with the present invention a multiplier circuit designated generally as 10. In the circuit 10 there is provided a linear phase comparator 11 for controlling the frequency $F_o$ of a VCO 16 wherein the frequency $F_o$ is the product of a reference frequency $F_D$ and multiplying factor R.

As seen in FIG. 2, one input of the phase comparator 11 is coupled to a source 12 of the reference signal having the frequency $F_D$, e.g. 10 megahertz (MHz), and a multiplier 13 for multiplying the output frequency of the source 12 by the multiplying factor R, wherein R ranges from 60 to 118. The second input of the phase comparator 11 is coupled by means of a feedback loop comprising the VCO 16 designated generally as 14, to the output of the phase comparator 11.

In the feedback loop 14 there is provided an operational amplifier circuit designated generally as 15, the VCO 16 and a loop gain stabilization filter network 17, the construction and operation of which will be described below. The output of the phase comparator 11 is coupled to the non-inverting input of an operational amplifier 18 in the circuit 15 and to ground through a load resistor $R_L$. The inverting input of the amplifier 18 is coupled to its output by a series coupled capacitor C and resistor R2 and to ground by means of a resistor R1.

In operation, the frequency $F_o$ of the VCO 16 is controlled by the phase difference between the two inputs to the comparator 11. Accordingly, a desired frequency $F_o$, within the range of 600 MHz to 1180 MHz, is obtained by selecting a suitable multiplying factor R within the range 60 to 118.

Figure 3:
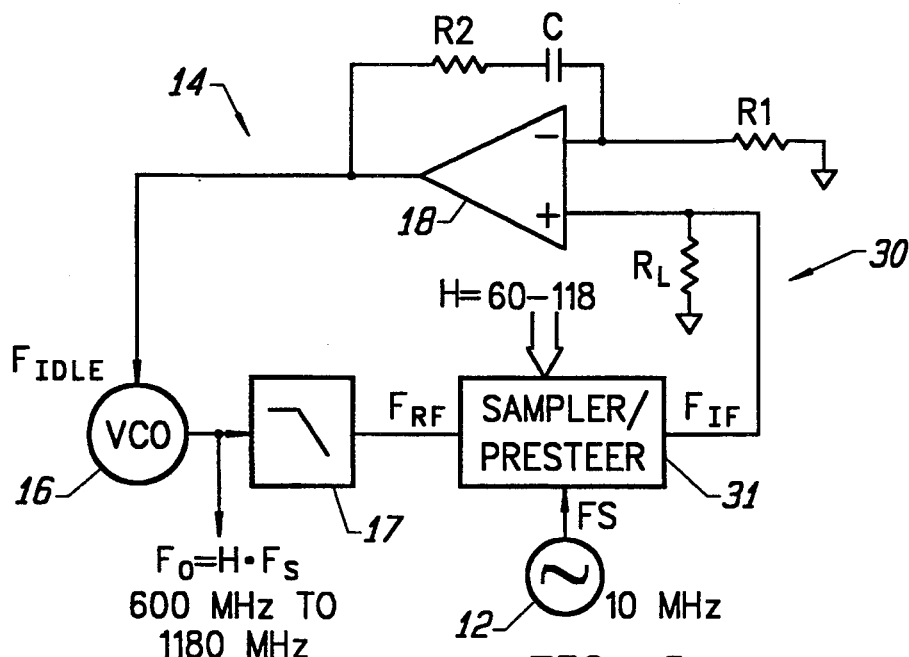
FIG. 3 is a block diagram of a multiplier circuit comprising a sampler/presteer circuit and loop gain stabilization circuit according to the present invention.

Referring to FIG. 3, there is provided in another embodiment of the present invention a multiplier circuit designated generally as 30 which is substantially identical to the multiplier circuit 10 of FIG. 2 but wherein the linear phase comparator 11 and multiplier 13 are replaced by a linear phase comparator comprising a harmonic sampler/presteer circuit 31. All other circuits are identical to the circuits described above with respect to FIG. 2 and therefore are identified using the same numerical designator used in the circuit of FIG. 2.

The sampler/presteer circuit 31 comprises an input for receiving a high frequency signal having a frequency $F_{rf}$ from the network 17, a sampling input for receiving a sampling signal $F_s$ from the source 12 and an output for providing an intermediate frequency (IF) signal having a frequency $F_{IF}$. As previously described, the IF signal becomes a null signal whenever the input frequency $F_{rf}$ is a harmonic of the sampling frequency $F_s$. For this reason, a presteer circuit is required to be used in conjunction with the harmonic sampler. As described in applicant's co-pending applications Ser. No. 08/060,755 and Ser. No. 08/051,624, the presteer circuit in the circuit 31 operates to drive the VCO to a predetermined nominal frequency. Thereafter, the frequency of the output of the VCO 16 is controlled by the harmonic sampler circuit 31.

In operation, the VCO 16 is driven and thereafter locked to a desired selected frequency which is a product of the harmonic number H of the sampler 31 and the frequency $F_s$. For example, with a reference frequency $F_s$ of 10 MHz an output frequency $F_o$ within a range of 600 MHz to 1180 MHz can be obtained by selecting a harmonic number H within a range of 60 to 118.

Figure 4:
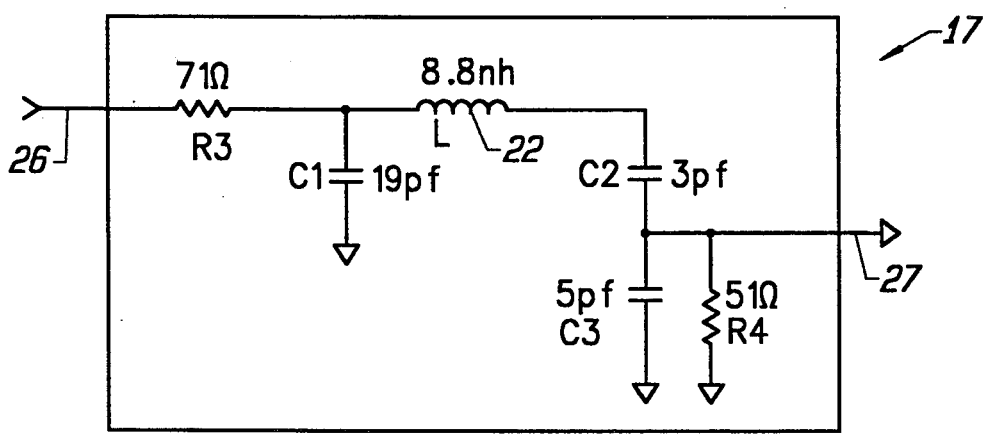
FIG. 4 is a schematic of a loop gain stabilization filter network for use in the circuits of FIGS. 2 and 3 according to the present invention.
Figure 5:
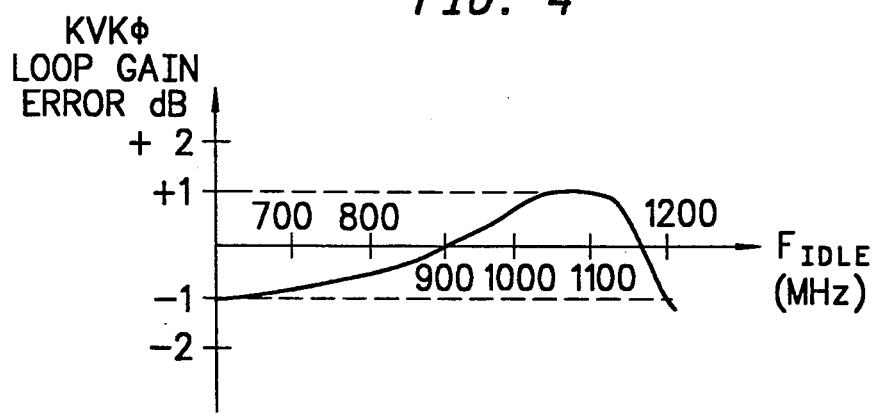
FIG. 5 is a diagram of loop gain error v. frequency in the circuits of FIGS. 2 and 3 according to the present invention.

Referring to FIG. 4, the gain stabilization filter network 17 in the multiplying circuits 10 and 30 of FIGS. 2 and 3 comprises a resistor R3, a capacitor C1, an inductor L, a capacitor C2, a capacitor C3 and a resistor R4. One end of the resistor R3 is coupled to an input port 26. The opposite end of the resistor R3 is coupled to one end of the inductor L and to ground through the capacitor C1. The opposite end of the inductor L is coupled to one end of the capacitor C2 and to ground through the capacitor C3. A node between the capacitors C2 and C3 is coupled to ground through the resistor R4 and to an output port 27. The resistors, capacitors and inductor in the circuit 17 have the following typical values:

$R3 = 71\ ohms$ $R4 = 51\ ohms$ $C1 = 19\ pf$ $C2 = 3\ pf$ $C3 = 5\ pf$ $L = 8.8\ nh$ Referring to FIG. 5, there is shown a diagram of the loop gain error $KVK\phi$ in decibels (dB) v. frequency over the frequency range of 600 MHz to 1200 MHz for the VCO 16 of the circuits of FIGS. 2 and 3. As seen from the following table and the diagram in FIG. 5, the filter 17 essentially makes the loop gain constant over the range of frequencies of 600 MHz to 1180 MHz of the VCO 16 by providing a compensation above and below 900 MHz which restricts the variation in loop gain as a function of the frequency of the VCO 16 to a range of from −1.15 dB at 600 MHz to 0 at 900 MHz and to +1.31 dB at 1100 MHz and −1.15 dB at 1180 MHz.

TABLE 1

| F | FILT | KV | KV-FILT | dB NORM to 900 MHz |
|---|---|---|---|---|
| 600 | .086 | 42 | 3.61 | −1.15 |

TABLE 1-continued

| F | FILT | KV | KV-FILT | dB NORM to 900 MHz |
|---|---|---|---|---|
| 700 | .087 | 42 | 3.65 | −1.05 |
| 800 | .090 | 42 | 3.78 | −.75 |
| 900 | .098 | 42 | 4.12 | 0.00 |
| 1000 | .113 | 40 | 4.52 | +.80 |
| 1100 | .141 | 39 | 4.79 | +1.31 |
| 1180 | .180 | 20 | 3.60 | −1.15 |

Figure 6:
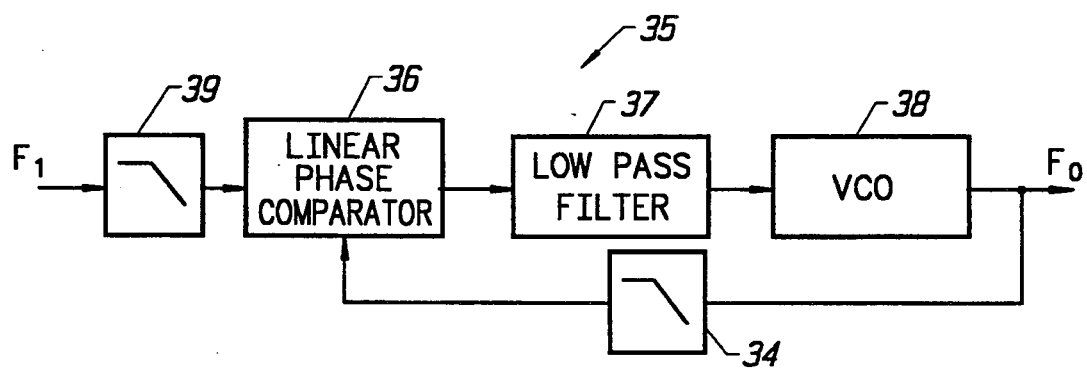
FIG. 6 is a generalized block diagram of a phase locked loop for use in a frequency divider circuit according to the present invention.

Referring to FIG. 6, there is provided a phase locked loop designated generally as 35 for use in dividing circuits according to the present invention. In the phase locked loop 35 there is provided a linear phase comparator 36, a lowpass filter 37, a VCO 38, a filter 34 and a loop gain stabilization circuit 39. The filter 34 is identical to the loop gain stabilization circuit 39 to make the circuit match the characteristics of a sampler in the same circuit.

In operation, the frequency of the VCO is controlled in a conventional manner by the phase difference between the signals applied to the inputs of the phase comparator 36. However, unlike the loop gain stabilization circuit 5 in FIG. 1, the loop gain stabilization circuit 39 is removed from the feedback loop of the loop 35 and placed in series with the reference signal input to the comparator 36. As will be further described below in connection with a description of the present invention relating to its embodiment in dividing circuits, the circuit 39 compensates for variations in the loop gain as a function of the frequency of the reference signal applied to the reference signal input of the comparator 36 by attenuating the reference signal at a rate of 6 dB/octave over a predetermined frequency range thereof, e.g. 600 MHz to 1180 MHz.

Figure 7:
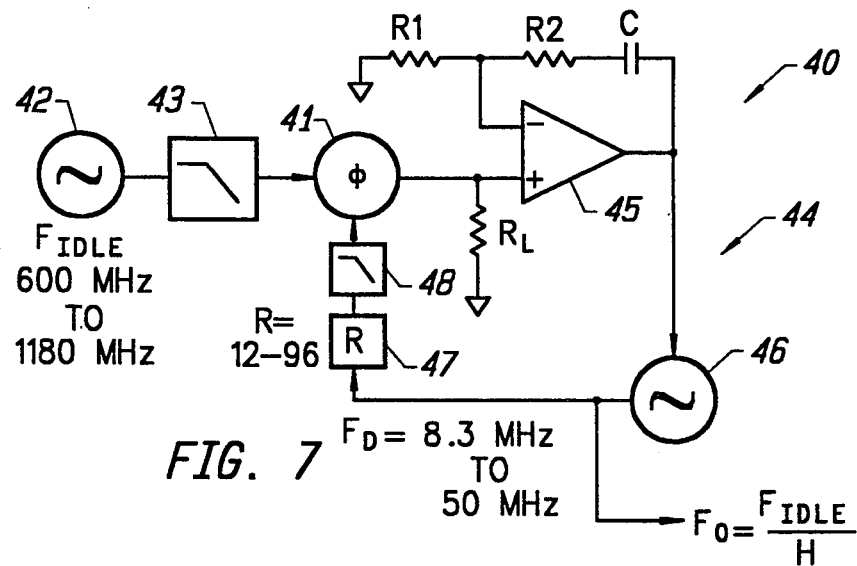
FIG. 7 is a block diagram of a divider circuit comprising a linear phase comparator and loop gain stabilization circuit according to the present invention.

Referring to FIG. 7, there is provided in accordance with another embodiment of the present invention a divider circuit designated generally as 40. The divider circuit 40 comprises a linear phase comparator 41. One input of the comparator 41, the reference signal input, is coupled to an oscillator 42 by means of a gain stabilization circuit 43, the construction and operation of which will be described below. A second input of the comparator 41, the feedback signal input, is coupled to its output by means of a feedback loop designated generally as 44 comprising an operational amplifier 45, a voltage controlled oscillator 46, a multiplier 47 and a filter 48 which is identical to the filter 43. The filter 48 is provided to make the circuit match the characteristics of the sampler in the same circuit as described below with respect to FIG. 8. The output of the comparator 41 is coupled to the non-inverting input of the amplifier 45 and to ground through a load resistor $R_L$. The inverting input of the amplifier 45 is coupled to ground through a resistor R1 and to its output by means of a resistor R2 in series with a capacitor C.

The oscillator 42 is designed to provide a selected frequency $F_{idle}$ within a range of frequencies of 600 MHz to 1180 MHz. The VCO 46 is provided to output a signal having a frequency $F_o$ which ranges from 8.3 MHz to 50 MHz. The multiplier 47 is provided to multiply the frequency of the VCO 46 by a factor R which ranges from 12 to 96.

In operation, the difference in the phase of the signals applied to the inputs of the comparator 41 is used to generate an error signal which is applied to the voltage control input of the VCO 46. In response the frequency of the VCO 46 as multiplied by the multiplier 47 is adjusted to cancel the phase difference between the inputs of the phase detector 41. Thus, for example, by a judicious selection of the output frequency of the oscillator 42 and the multiplying factor R within the ranges specified, as may be accomplished by a suitable programmed computer, the VCO 46 can be made to lock into a desired frequency within the range of from 8.3 MHz to 50 MHz.

Figure 8:
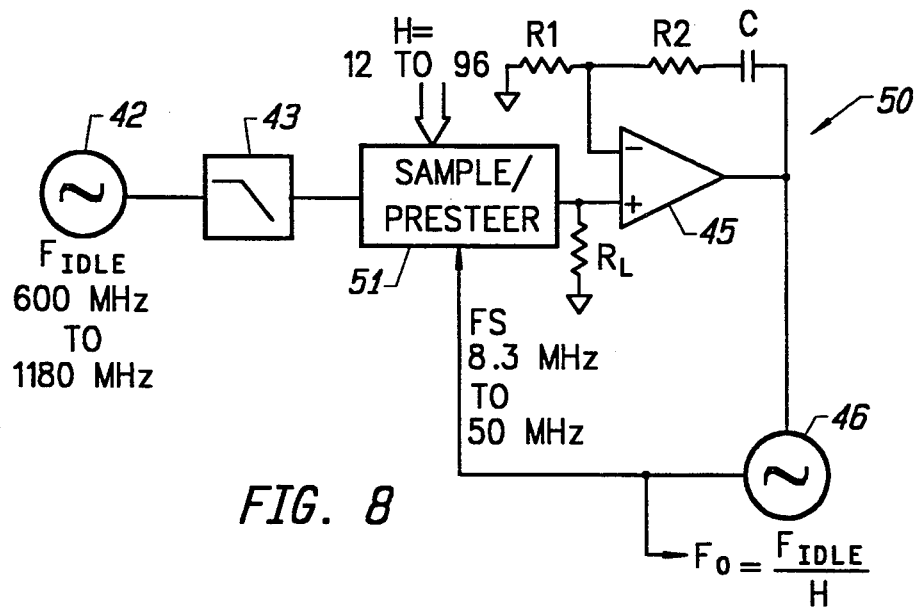
FIG. 8 is a block diagram of a divider circuit similar to the circuit of FIG. 6 comprising a sampler/presteer circuit and loop gain stabilization circuit according to the present invention.

Referring to FIG. 8, there is provided in accordance with another embodiment of the present invention a divider circuit designated generally as 50 which is identical to the divider circuit of FIG. 7 with the exception that the linear phase comparator 41 and multiplier 47 in the circuit 40 of FIG. 6 are replaced by a linear phase comparator comprising a harmonic sampler/presteer circuit 51. Accordingly, all other components of the circuit 50 bear the same numerical identifier as their corresponding components in the circuit 40 of FIG. 7.

The harmonic sampler and presteer circuit 51 of FIG. 8 operates in substantially the same way as the harmonic sampler and presteer circuit 31 of FIG. 3, except that the circuit 51 is used to lock the frequency of the VCO 46 to a selected sampling frequency $F_s$ as distinguished from the selected high frequency $F_{rf}$ obtained from the VCO 16. For example, the sampling frequency $F_s$ can range from 8.3 MHz to 50 MHz depending on the frequency $F_{idle}$ selected for the oscillator 42 which, for example, can range from 600 MHz to 1180 MHz and the harmonic number H which, for example, can range from 12 to 96. The actual frequency $F_{idle}$ and the harmonic number H is selected using a computer program.

Figure 9:
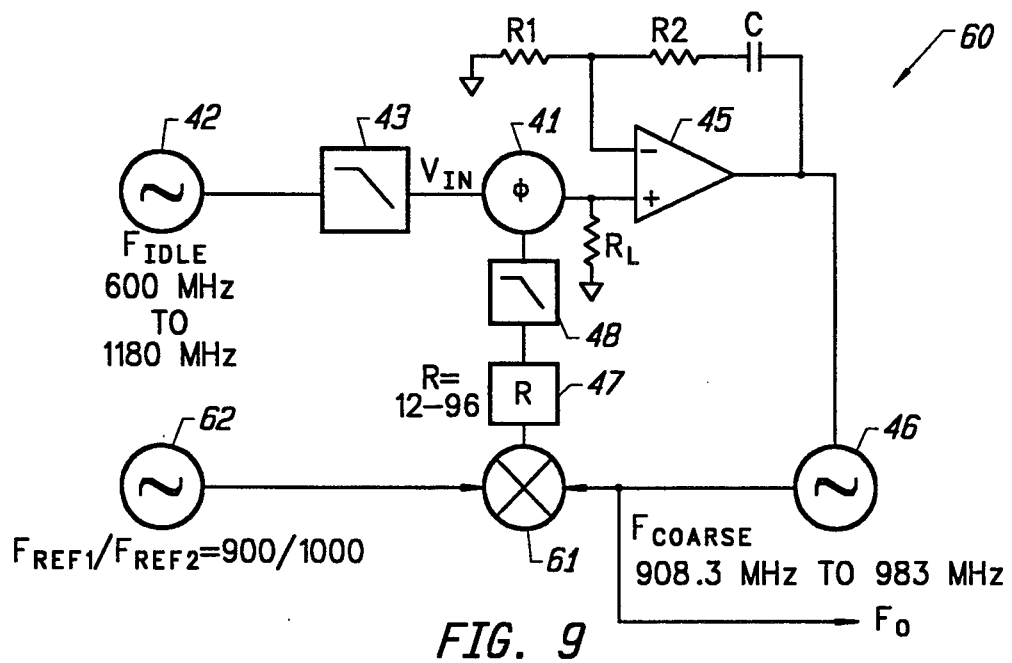
FIG. 9 is a block diagram of another embodiment of a divider circuit comprising a linear phase comparator and loop gain stabilization circuit according to the present invention.

Referring to FIG. 9, there is provided in another embodiment of the present invention a divider circuit designated generally as 60. The divider circuit 60 is substantially identical to the divider circuit 40 of FIG. 7, except that the input applied to the multiplier 47 is provided by a mixer 61 coupled to the output of the VCO 46 and a source 62 of a reference signal having a pair of selectable frequencies, e.g. 900 MHz and 1000 MHz. As described above with respect to the circuits of FIGS. 7 and 8, the filter 48 is provided to make the circuit match the characteristics of the sampler in the same circuit as described below with respect to FIG. 10.

The advantage of using the reference oscillator 62 and mixer 61 is that the output frequency range of the oscillator 46 can be substantially increased from a frequency range of 8.3 MHz to 50 MHz to a frequency range of 908.3 MHz to 983 MHz without increasing the multiplication factor R of the multiplier 47. By keeping the multiplication factor R of the multiplier 47 low, lower noise performance is maintained.

Figure 10:
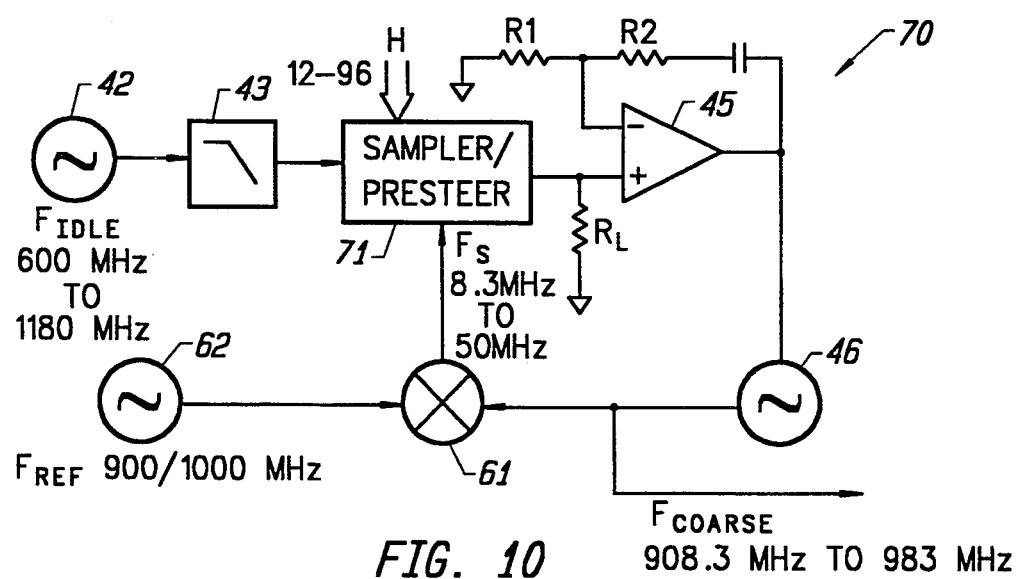
FIG. 10 is a block diagram of a divider circuit similar to the circuit of FIG. 8 comprising a sampler/presteer circuit and loop gain stabilization circuit according to another embodiment of the present invention.

Referring to FIG. 10, there is provided in accordance with another embodiment of the present invention a divider circuit designated generally as 70 which is identical to the divider circuit 60 of FIG. 9 except that the linear phase detector 41 and multiplier circuit 47 are replaced by a linear phase comparator comprising a harmonic sampler/presteer circuit 71.

The harmonic sampler and presteer circuit 70 of FIG. 10 operates in substantially the same way as the harmonic sampler and presteer circuit 51 of FIG. 8 except that the circuit 70 is used to lock the frequency of the VCO 46 to the frequency $F_{coarse}$ of the VCO 46 of FIG. 9.

Figure 11:
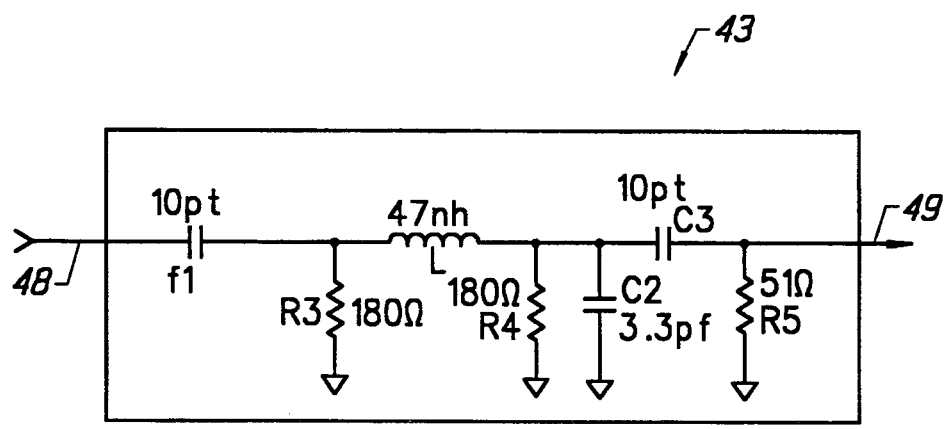
FIG. 11 is a block diagram of a loop gain stabilization filter network for use in the divider circuits of FIGS. 6–9 according to the present invention.

Referring to FIG. 11, there is provided in the loop gain stabilization circuit 43, a capacitor C1, a resistor R3, an inductor L, a resistor R4, a capacitor C2, a capacitor C3 and a resistor R5. One end of the capacitor C1 is coupled to an input port 48. The opposite end of the capacitor C1 is coupled to ground through the resistor R3 and to one end of the inductor L. The opposite end of the inductor L is coupled to ground through the resistor R4 in parallel with the capacitor C2 and to one end of the capacitor C3. The opposite end of the capacitor C3 is coupled to ground through the resistor R5 and to an output port 49. The capacitors, resistors and the inductor in the circuit 43 have the following typical values:

$C1 = 10\ pf$ $C2 = 3.1\ pf$ $C3 = 10\ pf$ $R3 = 180\ ohms$ $R4 = 180\ ohms$ $R5 = 50\ ohms$ $L = 47\ nh$ The open loop gain $A_{OL}$ of the circuits of FIGS. 8 and 10 comprising the samplers 51 and 71 is given by the following equation:

$$A_{OL} = \frac{(1.76 \times 10^{-6}\ F_s\ V_{IN}\ R_L)\ K_\nu H(R2)}{R1} \quad (1)$$

where
$F_s$ = sampling frequency
$H$ = harmonic number
$V_{IN}$ = input voltage to the sampler
and all other parameters are constant.

Equation 1 can be rewritten as follows:

$$A_{OL} = F_s \times H \times V_{IN} \times C \quad (2)$$

where $$C = \text{constant} \quad (3)$$

$$F_s = \frac{F_{idle}}{H}$$

Substituting equation 3 in equation 2, equation 2 can be rewritten as follows:

$$A_{OL} = \frac{F_{idle}}{H} \times H \times V_{IN} \times C \quad (4)$$

or $$A_{OL} = F_{idle} \times V_{IN} \times C \quad (5)$$

Figure 12:
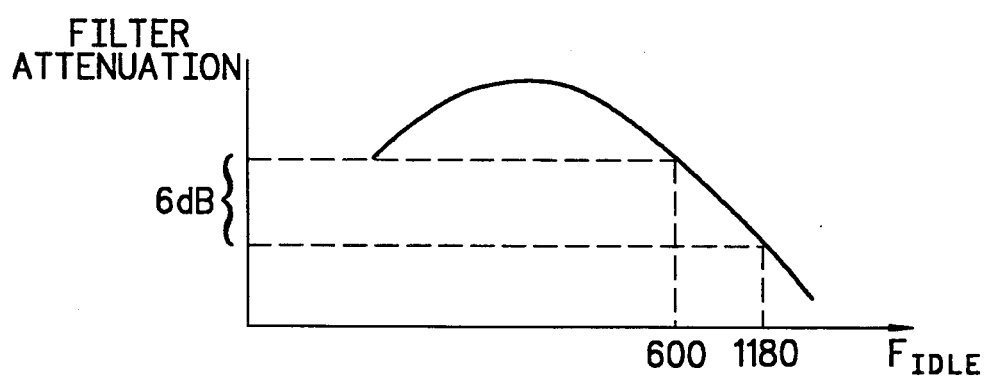
FIG. 12 is a diagram of the loop gain v. frequency in the circuits of FIGS. 6–9 according to the present invention.

Thus, to make the loop gain $A_{OL}$ constant as $F_{idle}$ increases, it can be seen that $V_{IN}$ must decrease as a linear function of $F_{idle}$ or at a rate of 6 dB/octave. The circuit of FIG. 11 provides the necessary attenuation 15 as shown in FIG. 12.

Equation (1) also defines the open loop gain for the linear phase detectors in the circuits of FIGS. 7 and 9, provided the harmonic number H is replaced by the multiplying factor R.

While preferred embodiments of the present invention are described above, it is contemplated that numerous modifications may be made thereto for particular applications without departing from the spirit and scope of the present invention. Accordingly, it is intended that the embodiments described be considered only as illustrative of the present invention and that the scope thereof should not be limited thereto but be determined by reference to the claims hereinafter provided.

What is claimed is:

1. A phase locked loop comprising:
   a source of a first signal having a predetermined range of frequencies;
   a source of a second signal;
   a linear phase detector responsive to said first signal and said second signal for comparing the relative phase of said first signal and said second signal; and
   a loop gain stabilization circuit means coupled between said source of said first signal and said linear phase detector for reducing the magnitude of variations in the loop gain of said phase locked loop over said predetermined range of frequencies of said first signal source.

2. A phase locked loop according to claim 1 wherein said source of a first signal comprises a VCO, said loop gain stabilization circuit means is coupled to the output of said VCO, said source of a second signal comprises an oscillator having a predetermined frequency $F_D$ and means for multiplying said predetermined frequency $F_D$ by a selected multiplying factor R.

3. A phase locked loop according to claim 2 wherein said predetermined range of frequencies of said first signal comprises approximately 600 MHz to 1180 MHz, said predetermined frequency $F_D$ comprises approximately 10 MHz and said means for multiplying said predetermined frequency $F_D$ comprises means for selectively multiplying said predetermined frequency $F_D$ by a multiplying factor of from 60 to 118.

4. A phase locked loop according to claim 2 wherein said loop gain stabilization circuit means comprises means for reducing the magnitude of the variations in the loop gain of said phase locked loop to a predetermined magnitude over said predetermined range of frequencies of said first signal.

5. A phase locked loop according to claim 4 wherein said predetermined magnitude is approximately ±one (1) dB over said predetermined range of frequencies of said first signal.

6. A phase locked loop according to claim 4 wherein said means for reducing the magnitude of variations in the loop gain of said phase locked loop comprises a filter network, said filter network comprising means for providing a resistance, means for providing a capacitance and means for providing an inductance.

7. A phase locked loop according to claim 6 wherein said filter network comprises:
   means for coupling one end of a first resistor to an input terminal and the opposite end of the first resistor to ground by means of a first capacitor and to one end of an inductor;
   means for coupling the opposite end of the inductor to ground through a second and a third capacitor; and
   means for coupling a node between said second and third capacitor to ground through a second resistor and to an output terminal.

8. A phase locked loop according to claim 7 wherein said first and second resistors comprise approximately 71 ohms and 51 ohms, respectively, said first, second and third capacitors comprise approximately 19 picofarads, 3 picofarads, and 5 picofarads, respectively, and said inductor comprises approximately 8.8 nanohenries.

9. A phase locked loop according to claim 1 wherein said source of a first signal having a said predetermined range of frequencies comprises a source of a first signal having a frequency $F_{rf}$ within said predetermined range of frequencies, said source of a second signal comprises a source of a sampling signal having a frequency $F_s$ for sampling said first signal, said linear phase detector comprises a harmonic sampler circuit means responsive to said first signal and said sampling signal for comparing the relative phase of said first signal and said sampling signal, and said loop gain stabilization circuit means comprises a loop gain stabilization circuit means coupled between said source of said first signal and said harmonic sampler for reducing the magnitude of variations in the loop gain of said phase locked loop over said predetermined range of frequencies of said first signal source.

10. A phase locked loop according to claim 9 wherein said source of said first signal having a frequency $F_{rf}$ within a predetermined range of frequencies comprises a VCO and said harmonic sampler circuit means comprises means for operating said harmonic sampler at a selected harmonic number H within a predetermined range of harmonic numbers H.

11. A phase locked loop according to claim 10 wherein said predetermined range of frequencies of said first signal comprises approximately 600 MHz to 1180 MHz and said predetermined range of harmonic numbers H is 60 to 118.

12. A phase locked loop according to claim 9 wherein said source of said first signal comprises a VCO and further comprising means responsive to an output of said harmonic sampler for controlling the frequency $F_{rf}$ of said VCO within said predetermined range of frequencies.

13. A phase locked loop according to claim 12 wherein said frequency controlling means comprises an operational amplifier.

14. A phase locked loop according to claim 1 wherein said source of said first signal comprises an oscillator having said predetermined range of frequencies $F_{idle}$, and said source of said second signal comprises a VCO having a predetermined range of frequencies $F_D$ and means for multiplying said range of frequencies $F_D$ by a selected multiplying factor R, said loop gain stabilization circuit means comprises means for attenuating said first signal at a predetermined rate over said predetermined range of frequencies of said first signal and further comprising means responsive to an output of said linear phase detector for controlling the frequency of said VCO.

15. A phase locked loop according to claim 14 wherein said attenuating means comprises means for attenuating said first signal at the rate of approximately 6 dB/octave over said predetermined range of frequencies of said input signal.

16. A phase locked loop according to claim 15 wherein said means for attenuating said first signal at the rate of approximately 6 dB/octave over said predetermined range of frequencies comprises a filter network comprising means for providing a resistance, means for providing a capacitance and means for providing and inductance.

17. A phase locked loop according to claim 16 wherein said means for providing said resistance, said capacitance and said inductance comprises:

means for providing a first, a second and a third resistance;
means for providing a first, a second and a third capacitance;
means for coupling one end of said first capacitance providing means in series with an input terminal;
means for coupling the opposite end of said first capacitance providing means to one end of said inductance providing means;
means for coupling the opposite end of said first capacitance providing means to ground by means of said first resistance providing means;
means for coupling the opposite end of said inductance providing means to ground by means of said second resistance providing means and said second capacitance providing means and to one end of said third capacitance providing means;
means for coupling said third capacitance providing means to ground by means of said third resistance providing means; and
means for coupling said third capacitance providing means to an output terminal.

18. A phase locked loop according to claim 17 wherein said means for providing a first, a second and a third resistance comprises means for providing a resistance of 180 ohms, 180 ohms and 51 ohms, respectively, said means for providing a first, a second and a third capacitance comprises means for providing a capacitance of 10 pf, 3.3 pf and 10 pf, respectively, and said means for providing said inductance comprises means for providing an inductance of 47 nanohenries.

19. A phase locked loop according to claim 14 wherein said predetermined range of frequencies of said source of said first signal comprises approximately 600 Hz to 1180 MHz, said predetermined frequency $F_D$ comprises a frequency in the range of approximately 8.3 MHz to 50 MHz and said means for multiplying said predetermined frequency $F_D$ comprises means for selectively multiplying said predetermined frequency $F_D$ by a multiplying factor R of from 12 to 96.

20. A phase locked loop according to claim 14 wherein said frequency controlling means comprises an operational amplifier.

21. A phase locked loop according to claim 14 wherein said source of a first signal having said predetermined range of frequencies comprises a source of a first signal having a frequency $F_{rf}$ within said predetermined range of frequencies, said source of a second signal comprises a source of a sampling signal having a frequency $F_s$ for sampling said first signal, said linear phase detector and said multiplying means comprises a harmonic sampler circuit means responsive to said first signal and said sampling signal for comparing the relative phase of said input signal and said sampling signal, and said loop gain stabilization circuit means comprises a loop gain stabilization circuit means coupled between said source of said first signal and said harmonic sampler for reducing the magnitude of variations in the loop gain of said phase locked loop over said predetermined range of frequencies of said first signal source.

22. A phase locked loop according to claim 21 wherein said source of said sampling signal comprises said VCO, said harmonic sampler circuit means comprises means for operating said harmonic sampler at a selected harmonic number H within a predetermined range of harmonic numbers H, and further comprising means responsive to an output of said harmonic sampler for controlling the frequency of said VCO.

23. A phase locked loop according to claim 21 wherein said range of frequencies of said first signal comprises approximately 600 MHz to 1180 MHz, the range of the frequencies of said sampling signal is approximately 8.3 MHz to 50 MHz and said predetermined range of harmonic numbers H is approximately 12 to 96.

24. A phase locked loop according to claim 14 wherein said predetermined range of frequencies of said first signal comprises a first predetermined range of frequencies and said source of said second signal comprises:
   a VCO for providing an output signal having a frequency $F_{coarse}$ within a second predetermined range of frequencies;
   a source of a first and a second reference frequency $F_{ref1}$ and $F_{ref2}$;
   means for mixing said output signal having said frequency $F_{coarse}$ with one of said first and second reference frequencies;
   means for multiplying the output of said mixing means by a multiplying factor R for providing said second signal; and
   means responsive to an output of said linear phase detector for controlling the frequency of said VCO for providing said output signal having said frequency $F_{coarse}$ within said second predetermined range of frequencies.

25. A phase locked loop according to claim 24 wherein said first reference frequency $F_{ref1}$ is selected when said frequency $F_{coarse}$ is within a first predetermined range of frequencies and said second reference frequency $F_{ref2}$ is selected when said frequency $F_{coarse}$ is within a second predetermined range of frequencies.

26. A phase locked loop according to claim 25 wherein said linear phase detector and said multiplying means comprises a harmonic sampler, said harmonic sampler circuit means comprises means for operating said harmonic sampler at a selected harmonic number H within a predetermined range of harmonic numbers H, and further comprising means responsive to an output of said harmonic sampler for controlling the frequency of said VCO.

27. A method of stabilizing the gain in a phase locked loop comprising the steps of:
   providing a first signal having a frequency within a predetermined range of frequencies;
   providing a second signal;
   comparing the relative phase of said first signal and said second signal in a linear phase comparator; and
   filtering said first signal for reducing the magnitude of variations in the loop gain of said phase locked loop over said predetermined range of frequencies of said first signal.

28. A method according to claim 27 wherein said step of providing said first signal having a frequency $F_{rf}$ within a predetermined range of frequencies comprises the step of providing said first signal having a frequency $F_{rf}$ within a predetermined range of frequencies from a voltage controlled oscillator (VCO).

29. A method according to claim 28 wherein said predetermined range of frequencies comprises approximately 600 MHz to 1180 MHz.

30. A method according to claim 27 wherein said step of providing said first signal having a frequency $F_{rf}$ within a predetermined range of frequencies comprises the step of providing said first signal having a frequency $F_{rf}$ within a predetermined range of frequencies from a voltage controlled oscillator (VCO) and further comprising the step of using an output of said linear phase comparator for controlling the frequency $F_{rf}$ of said VCO within said predetermined range of frequencies.

31. A method according to claim 30 wherein said step of controlling the frequency of said VCO comprises the step of controlling the frequency of said VCO using an operational amplifier.

32. A method according to claim 27 wherein said step of comparing comprises the step of comparing the relative phase of said first signal and said second signal in a harmonic sampler circuit means and said step of providing said second signal comprises the step of providing a sampling signal using a VCO and further comprising the step of using an output of said harmonic sampler for controlling the frequency of said VCO within said predetermined range of frequencies.

33. A method according to claim 27 wherein said predetermined range of frequencies comprises a first predetermined range of frequencies and said step of providing said second signal comprises the steps of:
   providing an output signal having a frequency $F_{coarse}$ within a second predetermined range of frequencies;
   providing a first reference frequency $F_{ref1}$ and a second reference frequency $F_{ref2}$;
   mixing said output signal having said frequency $F_{coarse}$ with one of said first and second reference frequencies; and
   using an output of said linear phase detector for controlling the frequency of said VCO for providing said output signal having said frequency $F_{coarse}$ within said second predetermined range of frequencies.

34. A method according to claim 33 wherein said first reference frequency $F_{ref1}$ is selected when said frequency $F_{coarse}$ is within a first predetermined range of frequencies and the second reference frequency $F_{ref2}$ is selected when said frequency $F_{coarse}$ is within a second predetermined range of frequencies.

35. A method according to claim 30 wherein said phase comparing step comprises the step of comparing said phase using a harmonic sampler having a first input for receiving a first signal having a frequency $F_{rf}$ and a second input for receiving a sampling signal having a sampling frequency $F_s$ and an output for providing an output signal having an intermediate frequency $F_{if}$ and said step of filtering said first signal comprises the step of reducing the magnitude of variations in the loop gain of said phase locked loop to approximately ±one (1) dB over said predetermined range of frequencies.

36. A method according to claim 32 wherein said phase comparing step comprises the step of using a harmonic sampler having a first input for receiving a first signal having a frequency $F_{rf}$ and a second input for receiving the sampling signal having a sampling frequency $F_s$ and an output for providing an output signal having an intermediate frequency $F_{if}$ and said step of filtering said first signal comprises the step of attenuating said first signal at the rate of approximately 6 dB/octave over said predetermined range of frequencies of said first signal.

37. A method according to claim 35 wherein said step of reducing the magnitude of variations in the loop gain of said phase locked loop comprises the step of providing a filter network having a resistance, a capacitance and an inductance.

38. A method according to claim 37 wherein said step of providing said resistance, said capacitance and said inductance comprises the steps of:

providing a first and a second resistance;

providing a first, a second and a third capacitance;

coupling one end of said first resistance in series with an input terminal;

coupling the opposite end of said first resistance to one end of said inductance;

coupling the opposite end of said first resistance to ground by means of said first capacitance;

coupling the opposite end of said inductance to said second capacitance;

coupling said second capacitance to ground by means of said third capacitance and said second resistance coupled in parallel; and coupling said second capacitance to an output terminal.

39. A method according to claim 38 wherein said steps of providing a first and a second resistance comprises the steps of providing a resistance of 71 ohms and 51 ohms, respectively, said steps of providing a first, a second and a third capacitance comprises the steps of providing a capacitance of 19 picofarads (pf) 3 pf and 5 pf, respectively, and said step of providing said inductance comprises the step of providing an inductance of 8.8 nanohenries.

40. A method according to claim 36 wherein said step of attenuating said first signal comprises the step of providing a filter network having a resistance, a capacitance and an inductance.

41. A method according to claim 40 wherein said step of providing said resistance, said capacitance and said inductance comprises the steps of:

providing a first, a second and a third resistance;

providing a first, a second and a third capacitance;

coupling one end of said first capacitance in series with an input terminal;

coupling the opposite end of said first capacitance to one end of said inductance;

coupling the opposite end of said first capacitance to ground by means of said first resistance;

coupling the opposite end of said inductance to ground by means of said second resistance and said second capacitance and to one end of said third capacitance;

coupling said third capacitance to ground by means of said third resistance; and coupling said third capacitance to an output terminal.

42. A method according to claim 41 wherein said steps of providing a first, a second and a third resistance comprises the steps of providing a resistance of 180 ohms, 180 ohms and 51 ohms, respectively, said steps of providing a first, a second and a third capacitance comprises the steps of providing a capacitance of 10 pf, 3.3 pf and 10 pf, respectively, and said step of providing said inductance comprises the step of providing an inductance of 47 nanohenries.

* * * * *